United States Patent
Okumura et al.

(10) Patent No.: US 10,476,259 B2
(45) Date of Patent: Nov. 12, 2019

(54) POWER CONVERSION DEVICE AND METHOD FOR DETERMINING OPERATIONAL STATE OF BREAKING DEVICE

(71) Applicant: Sumitomo Electric Industries, Ltd., Osaka-shi (JP)

(72) Inventors: Toshiaki Okumura, Osaka (JP); Naoki Ayai, Osaka (JP); Koichi Takeshita, Osaka (JP); Fumio Urakawa, Osaka (JP); Shinjirou Shinada, Osaka (JP); Tadatsugu Udono, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/308,106

(22) PCT Filed: Mar. 6, 2017

(86) PCT No.: PCT/JP2017/008743
§ 371 (c)(1),
(2) Date: Dec. 7, 2018

(87) PCT Pub. No.: WO2017/212712
PCT Pub. Date: Dec. 14, 2017

(65) Prior Publication Data
US 2019/0181635 A1    Jun. 13, 2019

(30) Foreign Application Priority Data
Jun. 9, 2016  (JP) ................................ 2016-115235

(51) Int. Cl.
*H02H 7/125* (2006.01)
*H02H 1/00* (2006.01)
(Continued)

(52) U.S. Cl.
CPC ........... *H02H 7/1227* (2013.01); *G01R 19/10* (2013.01); *G01R 25/00* (2013.01); *H02H 1/0007* (2013.01); *H02M 7/48* (2013.01)

(58) Field of Classification Search
CPC .... H02H 7/1252; H02H 1/0007; G01R 19/10; G01R 25/00; H02M 1/32
(Continued)

(56) References Cited

U.S. PATENT DOCUMENTS 4,873,601 A * 10/1989 Wakasa ..................... B66B 1/28
                                                            361/64
5,892,645 A *  4/1999 Watanabe ................ H02H 7/28
                                                            361/85
(Continued)

FOREIGN PATENT DOCUMENTS

JP       2008-259295 A      10/2008

*Primary Examiner* — Gary L Laxton
*Assistant Examiner* — Sisay G Tiku
(74) *Attorney, Agent, or Firm* — Baker Botts L.L.P.; Michael A. Sartori

(57) ABSTRACT

A power conversion device provided between a DC power supply and an AC electric path, including: a breaking device provided to at least one line of an output electric path in the power conversion device; a first voltage sensor provided on a primary side of the breaking device; a second voltage sensor provided on a secondary side of the breaking device; and a determination unit which calculates a primary-side voltage and a secondary-side voltage, and a primary-side phase and a secondary-side phase and determines that the breaking device is opened, by occurrence of an event in which an absolute value of a voltage difference between the primary-side voltage and the secondary-side voltage is greater than a voltage difference threshold value and an absolute value of a phase difference between the primary-
(Continued)

side phase and the secondary-side phase is greater than a phase difference threshold value.

14 Claims, 6 Drawing Sheets

(51) Int. Cl.
    *H02M 1/00*           (2006.01)
    *G01R 19/10*          (2006.01)
    *G01R 25/00*          (2006.01)
    *H02H 7/122*          (2006.01)
    *H02M 7/48*           (2007.01)

(58) Field of Classification Search
    USPC .................................. 361/62, 77, 85–87, 244
    See application file for complete search history.

(56) References Cited

U.S. PATENT DOCUMENTS

| | | | | |
|---|---|---|---|---|
| 6,407,897 | B1 * | 6/2002 | Yanniello | H02H 3/003 |
| | | | | 361/62 |
| 6,914,763 | B2 * | 7/2005 | Reedy | H02H 7/262 |
| | | | | 361/64 |
| 7,663,348 | B2 * | 2/2010 | Oohara | H02J 3/24 |
| | | | | 290/44 |
| 7,808,128 | B1 * | 10/2010 | Weber, Jr. | G01R 31/3275 |
| | | | | 307/127 |
| 8,331,071 | B2 * | 12/2012 | Benedict | H02J 3/38 |
| | | | | 361/93.9 |
| 8,526,155 | B2 * | 9/2013 | Kinoshita | H01H 9/563 |
| | | | | 361/107 |

* cited by examiner

POWER CONVERSION DEVICE AND METHOD FOR DETERMINING OPERATIONAL STATE OF BREAKING DEVICE

TECHNICAL FIELD

The present invention relates to a power conversion device and an operational state determination method for a breaking device.

This application claims priority on Japanese Patent Application No. 2016-115235 filed on Jun. 9, 2016, the entire contents of which are incorporated herein by reference.

BACKGROUND ART

For connecting a DC power supply such as a photovoltaic panel or a storage battery and an AC electric path, a power conversion device which performs DC/AC power conversion through high-frequency switching of semiconductor switches is used. The power conversion device has a breaking device for overcurrent protection, on an output electric path (AC side), for example. As the breaking device, a circuit breaker or a fuse can be used. It is preferable to use a fuse from the perspective of cost performance because it is very rare for the breaking device to actually interrupt overcurrent and a fuse is lower in cost than a circuit breaker.

There are also high-function fuses capable of outputting a contact signal at the time of melting. Also here, from the perspective of cost performance, a simple fuse not having such a function is preferable. In the case of using such a fuse, melting of the fuse can be detected through situation determination using, for example, a CPU (Central Processing Unit) based on voltages on both sides of the fuse (see, for example, Patent Literature 1). The situation determination refers to performing comparison with a threshold value and determination as to whether or not there is periodic change, with respect to each of the primary-side voltage and the secondary-side voltage of the fuse.

CITATION LIST

Patent Literature

PATENT LITERATURE 1: Japanese Laid-Open Patent Publication No. 2008-259295

SUMMARY OF INVENTION

One expression as a product of the present invention is a power conversion device provided between a DC power supply and an AC electric path, the power conversion device including: a breaking device provided to at least one line of an output electric path in the power conversion device; a first voltage sensor configured to detect a voltage between lines of the output electric path, on a primary side of the breaking device; a second voltage sensor configured to detect a voltage between lines corresponding to the lines of the output electric path, on a secondary side of the breaking device; and a determination unit configured to calculate a primary-side voltage and a secondary-side voltage, and a primary-side phase and a secondary-side phase, on the basis of detection outputs from the first voltage sensor and the second voltage sensor, and determine that the breaking device is opened, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value.

Another expression as a product is a power conversion device provided between a DC power supply and an AC electric path, the power conversion device including: a fuse provided to at least one line of an output electric path in the power conversion device; a first voltage sensor configured to detect a voltage between lines of the output electric path, on a primary side of the fuse; a second voltage sensor configured to detect a voltage between lines corresponding to the lines of the output electric path, on a secondary side of the fuse; and a determination unit configured to calculate a primary-side voltage and a secondary-side voltage, and a primary-side phase and a secondary-side phase, on the basis of detection outputs from the first voltage sensor and the second voltage sensor, determine that the fuse has melted, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value, and determine that a voltage of the AC electric path has reduced, by occurrence of an event in which an absolute value of the voltage difference is greater than the voltage difference threshold value and an absolute value of the phase difference is smaller than the phase difference threshold value.

One expression as a method is an operational state determination method for a breaking device, in which an operational state of the breaking device is determined by a determination unit provided to the power conversion device provided between a DC power supply and an AC electric path, the breaking device being provided to at least one line of an output electric path in the power conversion device, the operational state determination method including: detecting a voltage between lines of the output electric path, on a primary side of the breaking device, and detecting a voltage between lines corresponding to the lines of the output electric path, on a secondary side of the breaking device; calculating a primary-side voltage and a secondary-side voltage, and a primary-side phase and a secondary-side phase, on the basis of the voltages detected on the primary side and the secondary side; and determining that the breaking device is opened, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value.

DESCRIPTION OF EMBODIMENTS

Figure 1:
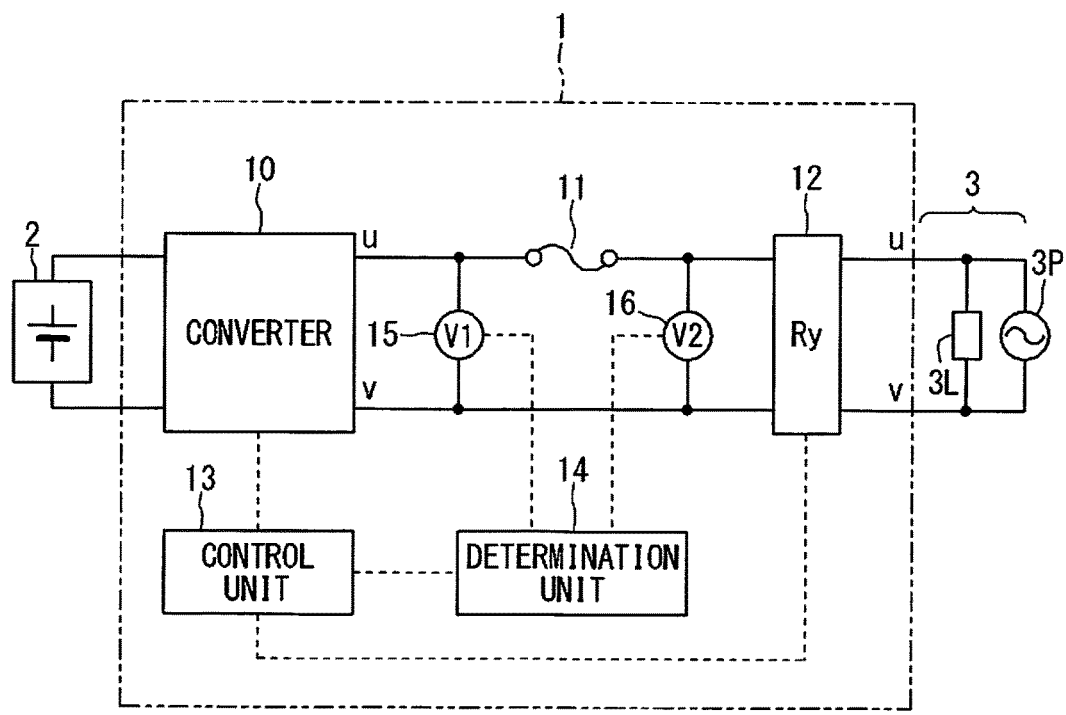
FIG. 1 is a diagram showing a first example of a circuit configuration of a distributed power supply system including a power conversion device.

Problems to be Solved by the Present Disclosure

In the method in which comparison with a threshold value and determination as to whether or not there is periodic change are performed with respect to each of the primary-side voltage and the secondary-side voltage of the fuse, it is difficult to discriminate a case where, for example, the AC voltage of a commercial power grid temporarily reduces sharply, from a case of melting of the fuse.

For example, when a state in which the voltage on the primary side of the fuse reduces and there is periodic change on the secondary side is detected, it can be determined that the fuse has melted. However, in a case where the fuse is normal but the AC voltage temporarily reduces, a state in which the voltage on the primary side of the fuse reduces and there is periodic change on the secondary side can occur. That is, it might be erroneously determined that the fuse has melted even though actually the fuse has not melted.

It is also possible to determine that the fuse has melted when a state is detected in which the voltage on the primary side of the fuse is equal to or smaller than a threshold value for the primary side and the voltage on the secondary side is equal to or greater than a threshold value for the secondary side. However, in a case where the output electric path is a single-phase three-wire type, it becomes difficult to perform determination, depending on which two lines are selected for detecting the voltage. That is, in a case where the fuse is normal but the AC voltage temporarily reduces, a state in which the voltage on the primary side of the fuse is equal to or smaller than the threshold value for the primary side and the voltage on the secondary side is equal to or greater than the threshold value for the secondary side, can occur. That is, it might be erroneously determined that the fuse has melted even though actually the fuse has not melted.

In view of the above problems, an object of the present disclosure is to, in determination as to whether or not a breaking device such as a fuse of a power conversion device is opened, prevent erroneous determination and reliably detect only a case where the breaking device is opened.

Effects of the Present Disclosure

According to the present disclosure, in determination as to whether or not a breaking device of a power conversion device is opened, erroneous determination can be prevented and only a case where the breaking device is opened can be reliably detected.

SUMMARY OF EMBODIMENTS

Summary of the embodiments of the present invention includes at least the following.

(1) This is a power conversion device provided between a DC power supply and an AC electric path, the power conversion device including: a breaking device provided to at least one line of an output electric path in the power conversion device; a first voltage sensor configured to detect a voltage between lines of the output electric path, on a primary side of the breaking device; a second voltage sensor configured to detect a voltage between lines corresponding to the lines of the output electric path, on a secondary side of the breaking device; and a determination unit configured to calculate a primary-side voltage and a secondary-side voltage, and a primary-side phase and a secondary-side phase, on the basis of detection outputs from the first voltage sensor and the second voltage sensor, and determine that the breaking device is opened, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value.

In the above power conversion device, when the breaking device is opened, the absolute value of the voltage difference becomes greater than the voltage difference threshold value and the absolute value of the phase difference becomes greater than the phase difference threshold value, and therefore, by occurrence of this event, opening of the breaking device can be detected. In this way, by detecting an event in which two requirements for the voltage difference and the phase difference based on relative comparison between both sides of the breaking device are satisfied, it is possible to reliably detect opening of the breaking device. As a result, in determination as to whether or not the breaking device of the power conversion device is opened, erroneous determination can be prevented and only a case where the breaking device is opened can be reliably detected.

(2) In the power conversion device of (1), for example, the determination unit can determine that a voltage of the AC electric path has reduced, by occurrence of an event in which an absolute value of the voltage difference is greater than the voltage difference threshold value and an absolute value of the phase difference is smaller than the phase difference threshold value.

When the voltage of the AC electric path temporarily reduces sharply, it can be assumed that the absolute value of the voltage difference becomes greater than the voltage difference threshold value even though the breaking device is closed. However, also in this case, a greater phase difference than the phase difference threshold value does not occur between the primary-side phase and the secondary-side phase. Therefore, it is possible to prevent the temporary voltage reduction from being erroneously determined as opening of the breaking device.

(3) In the power conversion device of (1) or (2), for example, the voltage difference threshold value is equal to or smaller than 10% of a normal voltage between the lines.

In this case, the voltage difference threshold value is set to a comparatively small value that is equal to or smaller than 10%, whereby it is ensured that this requirement is satisfied by opening of the breaking device. This can, on the contrary, lead to increase in possibility of erroneous determination, but by performing determination also for the phase difference by AND (logical conjunction), it is possible to prevent erroneous determination.

(4) In the power conversion device of any one of (1) to (3), for example, in a case where the power conversion device performs power interconnection, the determination unit performs the determination in a stopped state or a standby state, and in a case where the power conversion device performs stand-alone operation, the determination unit performs the determination in a stand-alone operation state.

Thus, the power conversion device which is capable of selectively performing power interconnection or stand-alone operation can perform determination in the same manner in both of the power interconnection case and the stand-alone operation case.

(5) In the power conversion device of any one of (1) to (4), for example, the output electric path is a single-phase three-wire type; when the primary-side voltage is a voltage between two lines that are voltage lines, the secondary-side voltage is also a voltage between two lines that are voltage lines; and when the primary-side voltage is a voltage between two lines including a neutral line, the secondary-side voltage is also a voltage between two lines including the neutral line.

Thus, also in the power conversion device of single-phase three-wire type, the determination can be performed in the same manner.

(6) From a more specific aspect, this is a power conversion device provided between a DC power supply and an AC electric path, the power conversion device including: a fuse provided to at least one line of an output electric path in the power conversion device; a first voltage sensor configured to detect a voltage between lines of the output electric path, on a primary side of the fuse; a second voltage sensor configured to detect a voltage between lines corresponding to the lines of the output electric path, on a secondary side of the fuse; and a determination unit configured to calculate a primary-side voltage and a secondary-side voltage, and a primary-side phase and a secondary-side phase, on the basis of detection outputs from the first voltage sensor and the second voltage sensor, determine that the fuse has melted, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value, and determine that a voltage of the AC electric path has reduced, by occurrence of an event in which an absolute value of the voltage difference is greater than the voltage difference threshold value and an absolute value of the phase difference is smaller than the phase difference threshold value.

In the above power conversion device, when the fuse has melted, the absolute value of the voltage difference becomes greater than the voltage difference threshold value and the absolute value of the phase difference becomes greater than the phase difference threshold value, and therefore, by occurrence of this event, melting of the fuse can be detected. In this way, by detecting an event in which two requirements for the voltage difference and the phase difference based on relative comparison between both sides of the fuse are satisfied, it is possible to reliably detect melting of the fuse.

In addition, when the voltage of the AC electric path temporarily reduces sharply, it can be assumed that the absolute value of the voltage difference becomes greater than the voltage difference threshold value even though the fuse is normal. However, also in this case, a greater phase difference than the phase difference threshold value does not occur between the primary-side phase and the secondary-side phase. Therefore, it is possible to prevent the temporary voltage reduction from being erroneously determined as melting of the fuse. As a result, in determination as to whether or not the breaking device of the power conversion device is opened, erroneous determination can be prevented and only a case where the breaking device is opened can be reliably detected.

(7) From a method aspect, this is an operational state determination method for a breaking device, in which an operational state of the breaking device is determined by a determination unit provided to the power conversion device provided between a DC power supply and an AC electric path, the breaking device being provided to at least one line of an output electric path in the power conversion device, the operational state determination method including: detecting a voltage between lines of the output electric path, on a primary side of the breaking device, and detecting a voltage between lines corresponding to the lines of the output electric path, on a secondary side of the breaking device; calculating a primary-side voltage and a secondary-side voltage, and a primary-side phase and a secondary-side phase, on the basis of the voltages detected on the primary side and the secondary side; and determining that the breaking device is opened, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value.

In the above operational state determination method for the breaking device, when the breaking device is opened, the absolute value of the voltage difference becomes greater than the voltage difference threshold value and the absolute value of the phase difference becomes greater than the phase difference threshold value, and therefore, by occurrence of this event, opening of the breaking device can be detected. In this way, by detecting an event in which two requirements for the voltage difference and the phase difference based on relative comparison between both sides of the breaking device are satisfied, it is possible to reliably detect opening of the breaking device. As a result, in determination as to whether or not the breaking device of the power conversion device is opened, erroneous determination can be prevented and only a case where the breaking device is opened can be reliably detected.

It is noted that the power conversion device described in the above (1) and (2) can also be expressed as follows. That is, this is a power conversion device provided between a DC power supply and an AC electric path, the power conversion device including: a breaking device provided to at least one line of an output electric path in the power conversion device; a first voltage sensor configured to detect a voltage between lines of the output electric path, on a primary side of the breaking device; a second voltage sensor configured to detect a voltage between lines corresponding to the lines of the output electric path, on a secondary side of the breaking device; and a determination unit configured to calculate a primary-side voltage and a secondary-side voltage, and a primary-side phase and a secondary-side phase, on the basis of detection outputs from the first voltage sensor and the second voltage sensor. The determination unit performs determination as to a voltage difference between the primary-side voltage and the secondary-side voltage, in advance of determination as to a phase difference. In a case where an absolute value of a voltage difference between the primary-side voltage and the secondary-side voltage is greater than a voltage difference threshold value, and then, (a) if an absolute value of a phase difference between the primary-side phase and the secondary-side phase is greater than a phase difference threshold value, the determination unit determines that the breaking device is opened, and (b) if an absolute value of a phase difference between the primary-side phase and the secondary-side phase is smaller than a phase difference threshold value, the determination unit determines that a voltage of the AC electric path has reduced.

In the above power conversion device, when the breaking device is opened, the absolute value of the voltage difference becomes greater than the voltage difference threshold value and the absolute value of the phase difference becomes greater than the phase difference threshold value, and therefore, by occurrence of this event, opening of the breaking device can be detected. In this way, by detecting an event in which two requirements for the voltage difference and the phase difference based on relative comparison between both sides of the breaking device are satisfied, it is possible to reliably detect opening of the breaking device. As a result, in determination as to whether or not the breaking device of the power conversion device is opened, erroneous determination can be prevented and only a case where the breaking device is opened can be reliably detected.

In addition, by performing the determination as to the voltage difference in advance, it is possible to reliably catch at least opening of the breaking device. Next, determination as to the phase difference is performed. If the voltage of the AC electric path temporarily reduces sharply, it can be assumed that the absolute value of the voltage difference becomes greater than the voltage difference threshold value even though the breaking device is closed. However, also in this case, a greater phase difference than the phase difference threshold value does not occur between the primary-side phase and the secondary-side phase. Therefore, it is possible to prevent the temporary voltage reduction from being erroneously determined as opening of the breaking device.

DETAILS OF EMBODIMENTS

Hereinafter, a power conversion device and an operational state determination method for a breaking device according to one embodiment of the present invention will be described with reference to the drawings.

Circuit Configuration in First Example

FIG. 1 is a diagram showing a first example of a circuit configuration of a distributed power supply system including a power conversion device. In FIG. 1, the power conversion device 1 is provided between a DC power supply 2 and an AC electric path 3 and performs DC/AC power conversion. The DC power supply 2 is, for example, a photovoltaic panel. The AC electric path 3 includes an electric path to a load 3L of a consumer, to which the power conversion device 1 is provided, and a commercial power grid 3P.

The power conversion device 1 includes: a converter 10 for performing DC/AC power conversion; a fuse 11 as a breaking device provided on one (u) of output electric paths u, v from the converter 10; a power interconnection relay 12; a control unit 13; a determination unit 14; a voltage sensor 15; and a voltage sensor 16. The converter 10 is configured as a single inverter, or an inverter with a DC/DC converter provided before the inverter (not shown). The voltage sensor 15 detects a u-v voltage on the primary side of the fuse 11. The voltage sensor 16 detects a u-v voltage on the secondary side of the fuse 11.

Each of the control unit 13 and the determination unit 14 includes a CPU and realizes necessary control function and determination function by the CPU executing software (computer program). The software is stored in a storage device (not shown) of the control unit 13 and the determination unit 14. It is noted that the control unit 13 and the determination unit 14 can also be configured with a circuit formed from only hardware not including a CPU. The control unit 13 controls switching operation of the converter 10, and also performs open/close control for the power interconnection relay 12. Normally, the power interconnection relay 12 is closed, and upon power outage of the commercial power grid 3P, is opened in accordance with a command from the control unit 13. Detection outputs from the voltage sensor 15 and the voltage sensor 16 are given to the determination unit 14. The control unit 13 and the determination unit 14 can pass and receive signals to and from each other.

<<Basic Operation as Power Conversion Device>>

The power conversion device 1 configured as described above converts a power outputted from the DC power supply 2 to an AC power by the converter 10. The AC voltage/current passes through the fuse 11 and the closed power interconnection relay 12 and is supplied to the AC electric path 3. The AC power is consumed by the load 3L, and the surplus power can be sold through reverse power flow.

<<Operational State Determination for Breaking Device>>

Next, operational state determination for the fuse 11 which is a breaking device will be described. First, a basic concept is as follows: instead of determination as to requirements for each voltage on the primary side and the secondary side of the fuse 11, melting of the fuse is detected on the basis of a fact that a relative voltage difference (in other words, potential difference between both ends of the fuse 11) between the voltage (effective value or wave crest value) on the primary side and the voltage (effective value or wave crest value) on the secondary side becomes greater than a threshold value. Here, for the purpose of more reliable melting detection, it is desirable that the threshold value is low (for example, equal to or smaller than 10% of normal voltage). However, if the threshold value is lowered, it is conceivable that, when sharp voltage reduction occurs, difference due to calculation timing occurs between the voltage on the primary side and the voltage on the secondary side which should be originally equal to each other, or difference occurs due to influence of noise. Thus, there is a risk of erroneous determination.

Accordingly, one more weighting requirement is considered. This requirement is that a phase difference between the voltage on the primary side and the voltage on the secondary side of the fuse 11 is greater than a threshold value. If the phase difference is greater than the threshold value, it is considered that the fuse 11 has melted, and if the phase difference is not greater than the threshold value, it is considered that the fuse 11 has not melted. However, in a case of phase detection using feedback-type phase locked loop (PLL), in such a state in which a phase difference occurs, the phase is gradually shifted, and therefore, as the threshold value is increased, detection of melting is delayed, and on the other hand, as the threshold value is decreased, it is more likely to cause erroneous determination due to influence of noise.

Accordingly, it is considered preferable that the two threshold values, i.e., a voltage difference threshold value and a phase difference threshold value are both set to be small to a certain extent, and when an event having the two requirements combined by AND (logical conjunction) is satisfied, it is determined that the fuse 11 has melted. That is, possibility of erroneous determination is decreased by combining the two requirements by AND.

Figure 2:
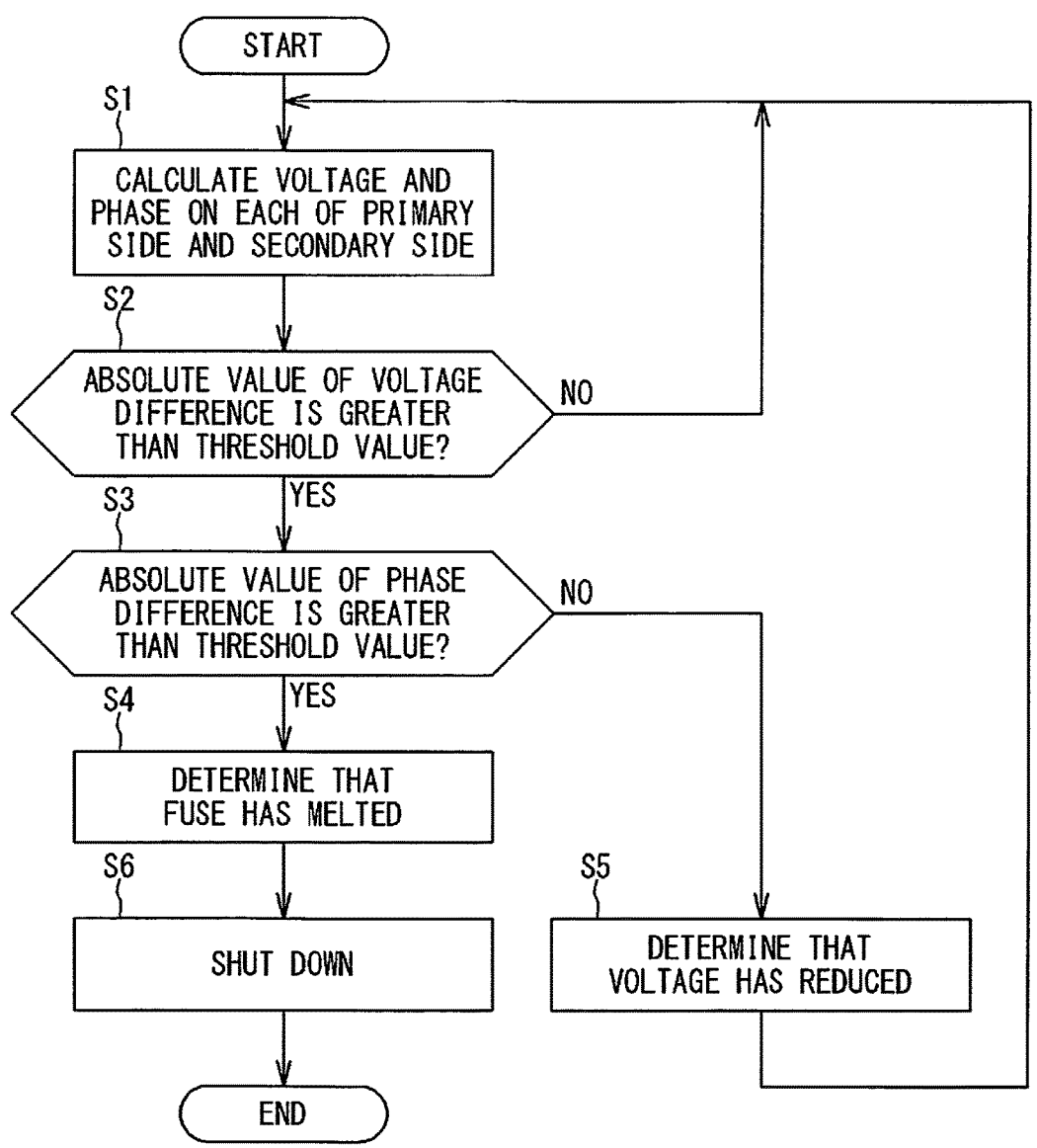
FIG. 2 is a flowchart showing a processing procedure of operational state determination for a fuse, which is executed by a determination unit.

FIG. 2 is a flowchart showing a processing procedure of operational state determination for the fuse 11, which is executed by the determination unit 14. The determination is performed in a state in which the power conversion device 1 is "stopped" or "standing by". In this state, the converter 10 does not output an AC voltage, but an AC voltage is inputted from the commercial power grid 3P into the power conversion device 1.

In FIG. 2, when the determination process is started, the determination unit 14 acquires a voltage detected by the voltage sensor 15 on the primary side of the fuse 11 and a voltage detected by the voltage sensor 16 on the secondary side of the fuse 11. These voltages are acquired over at least one AC cycle, and from the acquired voltages, a primary-side voltage V1 and a secondary-side voltage V2 as effective values (or wave crest values) are calculated (step S1). In addition, on the basis of the acquired voltages, a primary-side phase θ1 and a secondary-side phase θ2 are also calculated.

Next, the determination unit 14 calculates a voltage difference between the primary-side voltage V1 and the secondary-side voltage V2, and determines whether or not the absolute value of the voltage difference is greater than a voltage difference threshold value $\Delta V_{th}$ (step S2). That is, whether or not the following Expression (1) is satisfied is determined.

$$|V1-V2|>\Delta V_{th} \tag{1}$$

It is noted that a specific value of the voltage difference threshold value $\Delta V_{th}$ is, for example, equal to or smaller than 10% of a normal voltage between lines for which V1 and V2 are measured.

Here, in a normal state in which the fuse 11 is normal and there is no voltage reduction on the AC electric path 3, V1=V2 is satisfied, and therefore Expression (1) is not satisfied and a result of determination in step S2 is "No". Normally, the processing in steps S1 and S2 is repeated.

On the other hand, in the case where the fuse 11 has melted, Expression (1) is satisfied. If Expression (1) is satisfied, next, the determination unit 14 calculates a phase difference on the basis of the primary-side phase θ1 and the secondary-side phase θ2. Then, the determination unit 14 determines whether or not the absolute value of the phase difference is greater than the phase difference threshold value $\Delta \theta_{th}$ (step S3). That is, whether or not the following Expression (2) is satisfied is determined.

$$|\theta 1-\theta 2|>\Delta \theta_{th} \tag{2}$$

If Expression (2) is not satisfied, the determination unit 14 determines that a voltage reduction occurs (step S5), and returns to step S1. If Expression (2) is satisfied, the determination unit 14 determines that the fuse has melted (step S4), and issues, for example, a shut-down command to the control unit 13 (step S6). In this case, after the fuse is exchanged, the power conversion device 1 is restarted, whereby the process of the flowchart in FIG. 2 is performed again.

In Expression (1) and Expression (2), a case where the left-hand side and the right-hand side are equal to each other is not included, but may be included. That is, ">" may be replaced with "≥".

<<Summary>>

As described above, the determination unit 14 calculates the primary-side voltage and the secondary-side voltage, and the primary-side phase and the secondary-side phase, on the basis of detection outputs from the first voltage sensor 15 and the second voltage sensor 16, and determines that the fuse 11 has melted, by occurrence of an event in which the absolute value of a voltage difference between the primary-side voltage and the secondary-side voltage is greater than the voltage difference threshold value and the absolute value of a phase difference between the primary-side phase and the secondary-side phase is greater than the phase difference threshold value. When the fuse 11 melts and is opened, the absolute value of the voltage difference becomes greater than the voltage difference threshold value and the absolute value of the phase difference becomes greater than the phase difference threshold value, and therefore, by occurrence of this event, melting of the fuse 11 can be detected. In this way, by detecting an event in which two requirements for a voltage difference and a phase difference based on relative comparison between both sides of the fuse 11 are satisfied, it is possible to reliably detect melting of the fuse 11.

In addition, the determination unit 14 can determine that a voltage of the AC electric path 3 has reduced, by occurrence of an event in which the absolute value of the voltage difference is greater than the voltage difference threshold value and the absolute value of the phase difference is smaller than the phase difference threshold value. When the voltage of the AC electric path 3 temporarily reduces sharply, it can be assumed that the absolute value of the voltage difference becomes greater than the voltage difference threshold value even though the fuse 11 is normal. However, also in this case, a greater phase difference than the phase difference threshold value does not occur between the primary-side phase and the secondary-side phase. Therefore, it is possible to prevent the temporary voltage reduction from being erroneously determined as melting of the fuse.

In addition, the voltage difference threshold value is set to a comparatively small value that is equal to or smaller than 10% of the normal line-to-line voltage, whereby it is ensured that this requirement is satisfied by melting of the fuse 11. This can, on the contrary, lead to increase in possibility of erroneous determination, but by performing determination also for the phase difference by AND (logical conjunction), it is possible to prevent erroneous determination.

Circuit Configuration in Second Example

Figure 3:
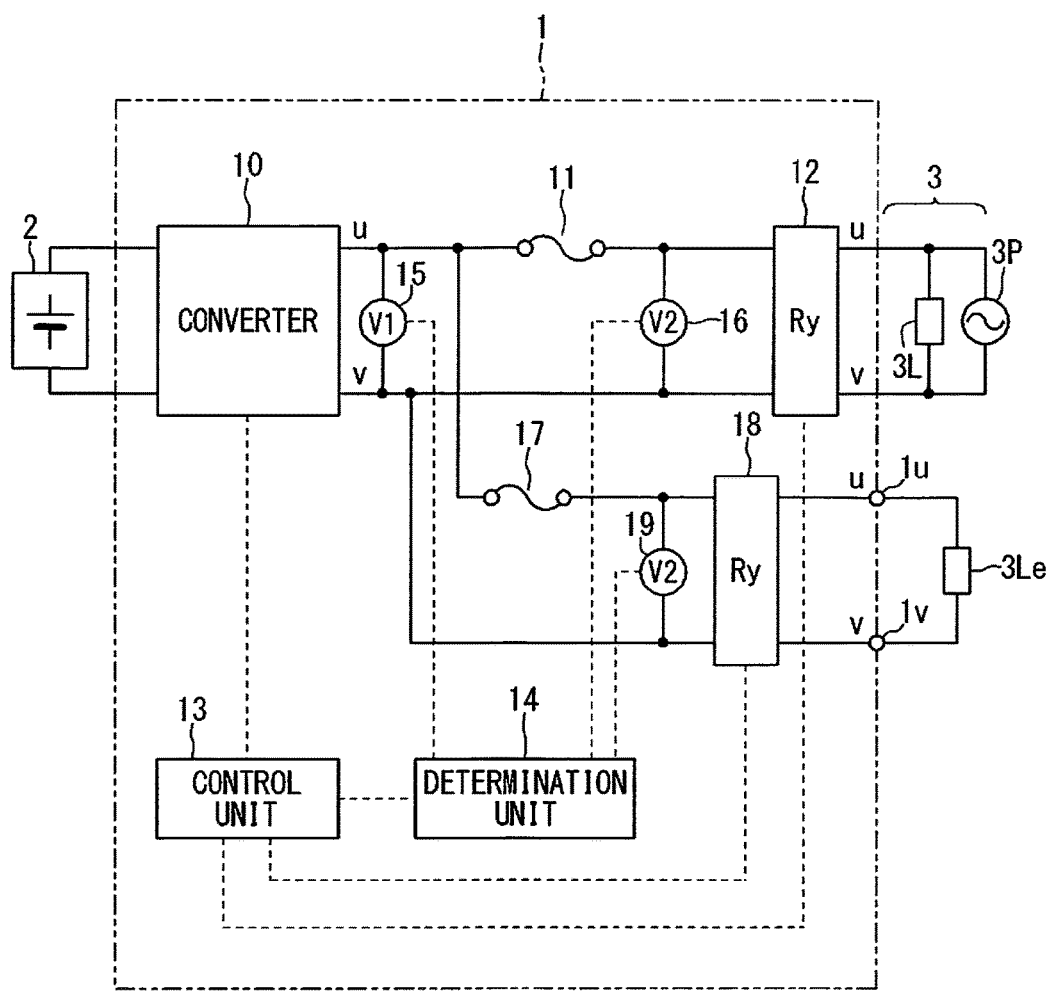
FIG. 3 is a diagram showing a second example of a circuit configuration of a distributed power supply system including a power conversion device.

FIG. 3 is a diagram showing a second example of a circuit configuration of a distributed power supply system including a power conversion device. Difference from FIG. 1 is that a stand-alone operation circuit is provided, and the other configurations are the same as those in FIG. 1. In FIG. 3, output electric paths u, v extending from the converter 10 in the power conversion device 1 branch as shown in the drawing, to form a stand-alone operation circuit having a fuse 17, a stand-alone operation relay 18, and a voltage sensor 19. The voltage sensor 19 detects a line-to-line voltage on the secondary side of the fuse 17, and sends the detection output to the determination unit 14. A load 3Le to be supplied with a power through stand-alone operation is connected to output terminals 1u, 1v for stand-alone operation.

<<Operational State Determination for Breaking Device>>

Operational state determination for the fuse 17 which is a breaking device in the stand-alone operation circuit is the same as the operational state determination (FIG. 2) for the fuse 11 in FIG. 1 described above.

However, the determination is performed in a state in which the power conversion device 1 is performing stand-alone operation. In this state, the stand-alone operation relay 18 is closed and the power interconnection relay 12 is opened. That is, the determination unit 14 performs the determination on the basis of an AC voltage outputted from the converter 10. Also in the case of stand-alone operation, melting of the fuse 17 due to overcurrent can occur. In addition, for example, if power consumption in the load 3Le sharply increases, temporary voltage reduction can also occur.

In this way, in the power conversion device 1 which is capable of selectively performing power interconnection or stand-alone operation, determination can be performed in a "stopped" or "standby" state in a case of power interconnection. In addition, in a case of stand-alone operation, determination can be performed in a stand-alone operation state. That is, determination can be performed in both of the power interconnection case and the stand-alone operation case.

The algorithm of determination by the determination unit 14 can be used for both power interconnection and stand-alone operation. Thus, a memory capacity needed for the determination unit 14 can be reduced.

In order to realize both modes of power interconnection and stand-alone operation, the scale of software mounted to the control unit 13 is increased, so that a considerable load is applied to the CPU of the control unit 13. If the control unit 13 is further caused to perform also operational state determination for the breaking device (fuse 11, 17), the load on the control unit 13 increases. However, by providing the determination unit 14 separately from the control unit 13 and causing the determination unit 14 to bear a job of operational state determination for the breaking device, increase in the load on the control unit 13 can be prevented. Such role sharing has an advantage of facilitating designing of the system. It is noted that, in a case where the processing capacity of the control unit 13 is extremely high and has some margin, the determination unit 14 can be incorporated as one of the functions of the control unit 13.

Circuit Configuration in Third Example

Figure 4:
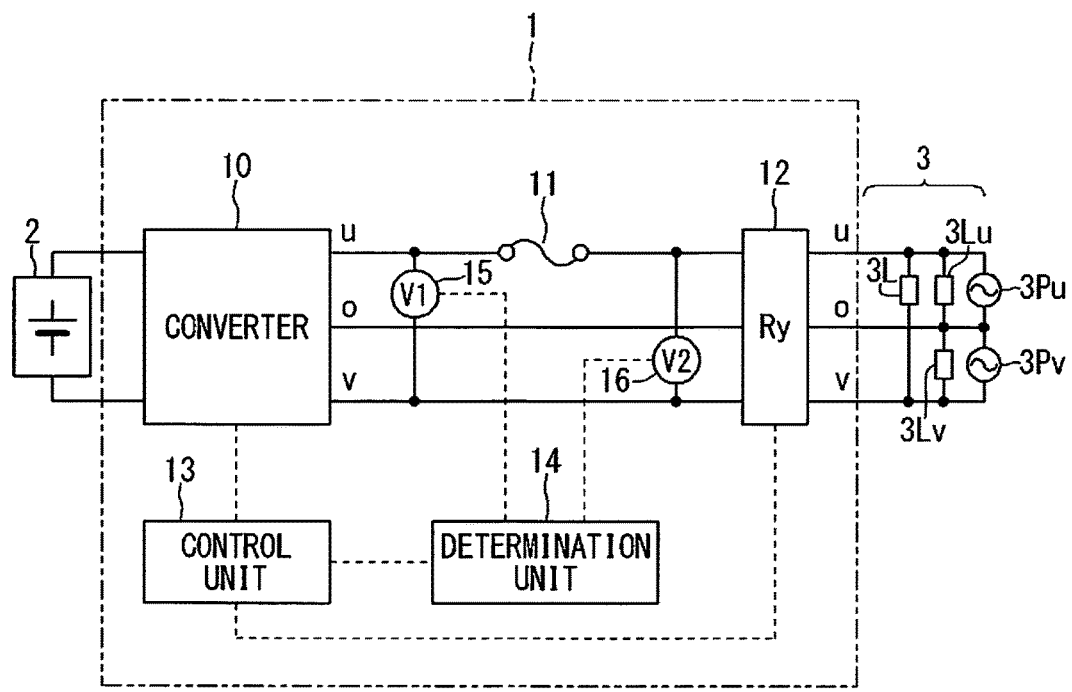
FIG. 4 is a diagram showing a third example of a circuit configuration of a distributed power supply system including a power conversion device.

FIG. 4 is a diagram showing a third example of a circuit configuration of a distributed power supply system including a power conversion device. In FIG. 4, a power conversion device 1 is provided between a DC power supply 2 and an AC electric path 3 of a single-phase three-wire type, and performs DC/AC power conversion. The single-phase three wires are composed of output electric paths u, v which are voltage lines, and an output electric path "o" which is a neutral line. The DC power supply 2 is, for example, a photovoltaic panel. The AC electric path 3 includes electric paths to loads 3L, 3Lu, 3Lv of a consumer, to which the power conversion device 1 is provided, and commercial power grids 3Pu, 3Pv of a single-phase three-wire type. The load 3L is a load between u and v, the load 3Lu is a load between u and o, and the load 3Lv is a load between v and o.

The power conversion device 1 includes: a converter 10 for performing DC/AC power conversion; a fuse 11 as a breaking device provided on the path u of the output electric paths u, o, v from the converter 10; a power interconnection relay 12; a control unit 13; a determination unit 14; a voltage sensor 15; and a voltage sensor 16. These functions are the same as those in FIG. 1. It is noted that the voltage sensor 15 detects a u-v voltage (202 V) on the primary side of the fuse 11. The voltage sensor 16 detects a u-v voltage (202 V) on the secondary side of the fuse 11.

<<Operational State Determination for Breaking Device>>

Operational state determination for the fuse 11 in FIG. 4 is the same as the operational state determination (FIG. 2) for the fuse 11 in FIG. 1 described above.

Thus, also in the power conversion device 1 of a single-phase three-wire type, the operational state determination for the fuse 11 can be performed in the same manner.

Circuit Configuration in Fourth Example

Figure 5:
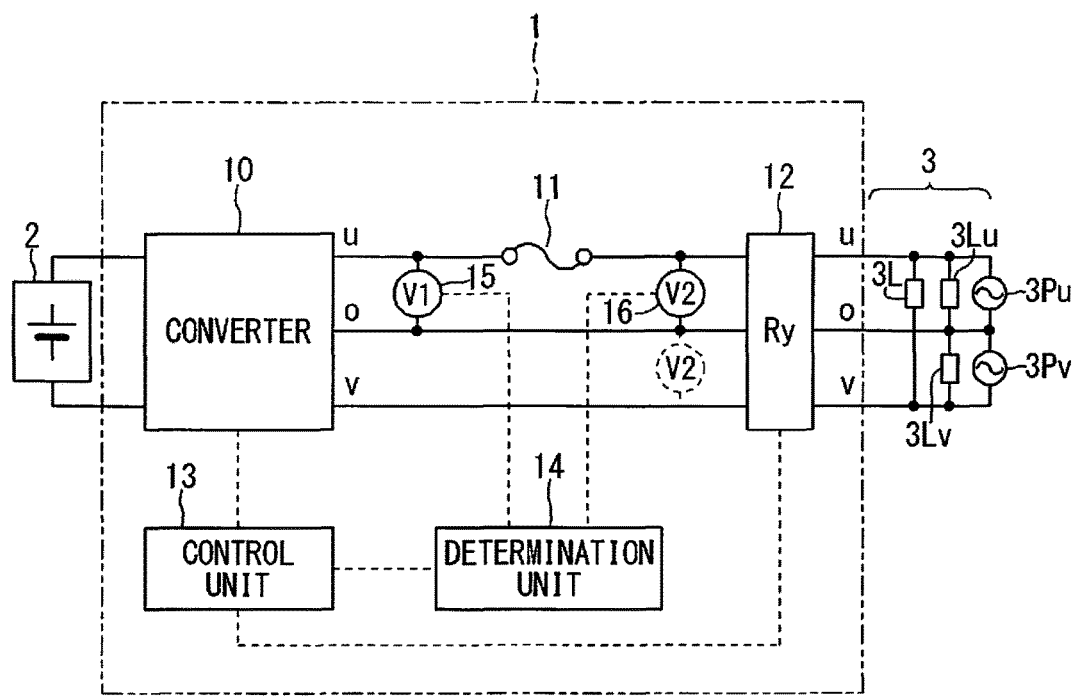
FIG. 5 is a diagram showing a fourth example of a circuit configuration of a distributed power supply system including a power conversion device.

FIG. 5 is a diagram showing a fourth example of a circuit configuration of a distributed power supply system including a power conversion device. Difference from FIG. 4 is that the voltage sensor 15 and the voltage sensor 16 detect u-o voltages (101 V), and the other configurations are the same as those in FIG. 4. It is noted that the voltage sensor 16 may be provided between lines v and o, instead of lines u and o. Since a voltage difference is calculated on the left-hand side of the aforementioned Expression (1), the primary-side voltage V1 and the secondary-side voltage V2 of the fuse 11 need to be equalized at the same voltage level. That is, if the primary-side voltage V1 is a voltage of 200 V system (202 V), the secondary-side voltage V2 is also set as voltage of 200 V system, or if the primary-side voltage V1 is a voltage of 100 V system (101 V), the secondary-side voltage V2 is also set as voltage of 100 V system. However, one of the voltage sensor 15 on the primary side and the voltage sensor 16 on the secondary side may be set for 200 V system, and the other one may be set for 100 V system. In this case, one of the detected voltages may be converted (multiplied by 2 or 0.5).

In a case where the fuse 11 is provided on the output electric path v, also the voltage sensors 15, 16 are provided correspondingly.

<<Operational State Determination for Breaking Device>>

Operational state determination for the fuse 11 in FIG. 5 is the same as the operational state determination (FIG. 2) for the fuse 11 in FIG. 1 and FIG. 4 described above.

Circuit Configuration in Fifth Example

Figure 6:
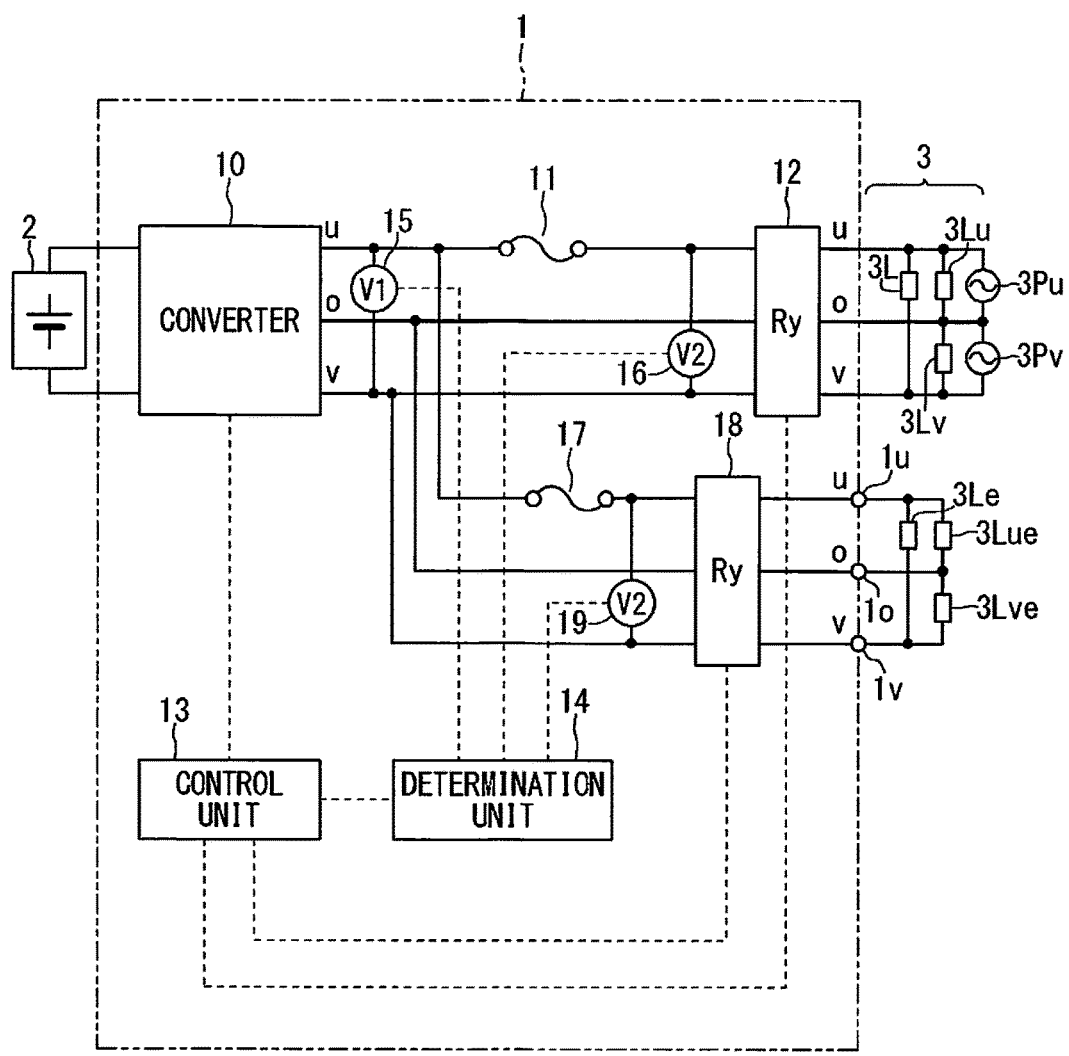
FIG. 6 is a diagram showing a fifth example of a circuit configuration of a distributed power supply system including a power conversion device.

FIG. 6 is a diagram showing a fifth example of a circuit configuration of a distributed power supply system including a power conversion device. Difference from FIG. 4 is that a stand-alone operation circuit is provided, and the other configurations are the same as those in FIG. 4. In FIG. 6, output electric paths u, o, v extending from the converter 10 in the power conversion device 1 branch as shown in the drawing, to form a stand-alone operation circuit having a fuse 17, a stand-alone operation relay 18, and a voltage sensor 19. The voltage sensor 19 detects a u-v voltage on the secondary side of the fuse 17, and sends the detection output to the determination unit 14. For example, loads 3Le, 3Lue, 3Lve to be supplied with a power through stand-alone operation is connected to output terminals 1u, 1o, 1v for stand-alone operation. It is noted that, as previously described also in the fourth example, the voltage sensors 15, 16, 19 may be provided in various manners without limitation to FIG. 6 (between u and v), that is, they may be provided such that the same voltage level can be obtained therefrom.

<<Operational State Determination for Breaking Device>>

Operational state determination for the fuse 17 which is a breaking device in the stand-alone operation circuit in FIG.

6 is the same as the operational state determination (FIG. 2) for the fuse 11 in FIG. 1 described above.

This is the end of descriptions for the examples of circuit configurations.

<<Others>>

In the above description, the case where the breaking device is the fuse 11 has been described. However, instead of the fuse 11, a circuit breaker may be used, and also in this case, determination by the determination unit 14 can be performed in the same manner. That is, it is possible to perform operational state determination, using a circuit breaker not having an auxiliary contact for giving notification of tripping.

In the above description, the case where the DC power supply 2 is a photovoltaic panel has been described. However, the DC power supply 2 may be a storage battery. In the case of storage battery, for example, in FIG. 3, the converter 10 performs bidirectional power conversions. Then, a power is supplied from the commercial power grid 3P to charge the storage battery, and upon power outage of the commercial power grid 3P, the power stored in the storage battery 2 can be supplied to the load 3Le through stand-alone operation.

For example, the DC power supply 2 in FIG. 1 may be a storage battery. In this case, for example, a night-time power of the commercial power grid 3P is stored in the storage battery 2, and the stored power can be supplied to the load 3L during the daytime. It is noted that, in this case, power selling through reverse power flow is not permitted, and therefore only consumption in the load 3L can be performed.

It is noted that the embodiments disclosed herein are merely illustrative in all aspects and should not be recognized as being restrictive. The scope of the present invention is defined by the scope of the claims, and is intended to include meaning equivalent to the scope of the claims and all modifications within the scope.

REFERENCE SIGNS LIST 1 power conversion device
1u, 1o, 1v output terminal
2 DC power supply
3 AC electric path
3P, 3Pu, 3Pv commercial power grid
3L, 3Lu, 3Lv, 3Le, 3Lue, 3Lve load
10 converter
11 fuse
12 power interconnection relay
13 control unit
14 determination unit
15 voltage sensor
16 voltage sensor
17 fuse
18 stand-alone operation relay
19 voltage sensor

The invention claimed is:

1. A power conversion device provided between a DC power supply and an AC electric path, the power conversion device comprising:
   a breaking device provided to at least one line of an output electric path in the power conversion device;
   a first voltage sensor configured to detect a voltage between lines of the output electric path, on a primary side of the breaking device;
   a second voltage sensor configured to detect a voltage between lines corresponding to the lines of the output electric path, on a secondary side of the breaking device; and
   a determination unit configured to calculate a primary-side voltage and a secondary-side voltage, and a primary-side phase and a secondary-side phase, on the basis of detection outputs from the first voltage sensor and the second voltage sensor, and determine that the breaking device is opened, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value.

2. The power conversion device according to claim 1, wherein
   the determination unit determines that a voltage of the AC electric path has reduced, by occurrence of an event in which the absolute value of the voltage difference is greater than the voltage difference threshold value and the absolute value of the phase difference is smaller than the phase difference threshold value.

3. The power conversion device according to claim 2, wherein
   the voltage difference threshold value is equal to or smaller than 10% of a normal voltage between the lines.

4. The power conversion device according to claim 2, wherein
   in a case where the power conversion device performs power interconnection, the determination unit performs the determination in a stopped state or a standby state, and
   in a case where the power conversion device performs stand-alone operation, the determination unit performs the determination in a stand-alone operation state.

5. The power conversion device according to claim 2, wherein
   the output electric path is a single-phase three-wire type,
   when the primary-side voltage is a voltage between two lines that are voltage lines, the secondary-side voltage is also a voltage between two lines that are voltage lines, and
   when the primary-side voltage is a voltage between two lines including a neutral line, the secondary-side voltage is also a voltage between two lines including the neutral line.

6. The power conversion device according to claim 1, wherein
   the voltage difference threshold value is equal to or smaller than 10% of a normal voltage between the lines.

7. The power conversion device according to claim 6, wherein
   in a case where the power conversion device performs power interconnection, the determination unit performs the determination in a stopped state or a standby state, and
   in a case where the power conversion device performs stand-alone operation, the determination unit performs the determination in a stand-alone operation state.

8. The power conversion device according to claim 6, wherein
   the output electric path is a single-phase three-wire type,
   when the primary-side voltage is a voltage between two lines that are voltage lines, the secondary-side voltage is also a voltage between two lines that are voltage lines, and when the primary-side voltage is a voltage between two lines including a neutral line, the secondary-side voltage is also a voltage between two lines including the neutral line.

9. The power conversion device according to claim 1, wherein
in a case where the power conversion device performs power interconnection, the determination unit performs the determination in a stopped state or a standby state, and
in a case where the power conversion device performs stand-alone operation, the determination unit performs the determination in a stand-alone operation state.

10. The power conversion device according to claim 9, wherein
the output electric path is a single-phase three-wire type,
when the primary-side voltage is a voltage between two lines that are voltage lines, the secondary-side voltage is also a voltage between two lines that are voltage lines, and
when the primary-side voltage is a voltage between two lines including a neutral line, the secondary-side voltage is also a voltage between two lines including the neutral line.

11. The power conversion device according to claim 1, wherein
the output electric path is a single-phase three-wire type,
when the primary-side voltage is a voltage between two lines that are voltage lines, the secondary-side voltage is also a voltage between two lines that are voltage lines, and
when the primary-side voltage is a voltage between two lines including a neutral line, the secondary-side voltage is also a voltage between two lines including the neutral line.

12. A power conversion device provided between a DC power supply and an AC electric path, the power conversion device comprising:
a fuse provided to at least one line of an output electric path in the power conversion device;
a first voltage sensor configured to detect a voltage between lines of the output electric path, on a primary side of the fuse;
a second voltage sensor configured to detect a voltage between lines corresponding to the lines of the output electric path, on a secondary side of the fuse; and
a determination unit configured to
calculate a primary-side voltage and a secondary-side voltage, and a primary-side phase and a secondary-side phase, on the basis of detection outputs from the first voltage sensor and the second voltage sensor,
determine that the fuse has melted, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value, and
determine that a voltage of the AC electric path has reduced, by occurrence of an event in which the absolute value of the voltage difference is greater than the voltage difference threshold value and the absolute value of the phase difference is smaller than the phase difference threshold value.

13. An operational state determination method for a breaking device, in which an operational state of the breaking device is determined by a determination unit provided to a power conversion device provided between a DC power supply and an AC electric path, the breaking device being provided to at least one line of an output electric path in the power conversion device, the operational state determination method comprising:
detecting a voltage between lines of the output electric path, on a primary side of the breaking device, and detecting a voltage between lines corresponding to the lines of the output electric path, on a secondary side of the breaking device;
calculating a primary-side voltage and a secondary-side voltage, and a primary-side phase and a secondary-side phase, on the basis of the voltages detected on the primary side and the secondary side; and
determining that the breaking device is opened, by occurrence of an event in which an absolute value of a voltage difference between the primary-side voltage and the secondary-side voltage is greater than a voltage difference threshold value and an absolute value of a phase difference between the primary-side phase and the secondary-side phase is greater than a phase difference threshold value.

14. A power conversion device provided between a DC power supply and an AC electric path, the power conversion device comprising: a breaking device provided to at least one line of an output electric path in the power conversion device; a first voltage sensor configured to detect a voltage between lines of the output electric path, on a primary side of the breaking device; a second voltage sensor configured to detect a voltage between lines corresponding to the lines of the output electric path, on a secondary side of the breaking device; and a determination unit configured to calculate a primary-side voltage and a secondary-side voltage, and a primary-side phase and a secondary-side phase, on the basis of detection outputs from the first voltage sensor and the second voltage sensor, wherein the determination unit performs determination as to a voltage difference between the primary-side voltage and the secondary-side voltage, in advance of determination as to a phase difference, and in a case where an absolute value of the voltage difference between the primary-side voltage and the secondary-side voltage is greater than a voltage difference threshold value, and then, (a) if an absolute value of the phase difference between the primary-side phase and the secondary-side phase is greater than a phase difference threshold value, the determination unit determines that the breaking device is opened, and (b) if the absolute value of the phase difference between the primary-side phase and the secondary-side phase is smaller than the phase difference threshold value, the determination unit determines that a voltage of the AC electric path has reduced.

* * * * *